(12) United States Patent
Yamamoto

(10) Patent No.: US 8,610,164 B2
(45) Date of Patent: Dec. 17, 2013

(54) LIGHT EMITTING DEVICE

(71) Applicant: Saiki Yamamoto, Hong Kong (CN)

(72) Inventor: Saiki Yamamoto, Hong Kong (CN)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/665,362

(22) Filed: Oct. 31, 2012

(65) Prior Publication Data

US 2013/0056787 A1    Mar. 7, 2013

Related U.S. Application Data

(62) Division of application No. 12/866,383, filed as application No. PCT/JP2009/051238 on Jan. 27, 2009, now Pat. No. 8,314,442.

(30) Foreign Application Priority Data

Feb. 8, 2008  (JP) ................... 2008-029267
Sep. 3, 2008  (JP) ................... 2008-225506

(51) Int. Cl.
*H01L 33/00*    (2010.01)

(52) U.S. Cl.
USPC ............. 257/99; 257/676; 257/E33.056

(58) Field of Classification Search
USPC ............... 257/99, 676, E33.056
See application file for complete search history.

(56) References Cited

U.S. PATENT DOCUMENTS

| D496,007 S | 9/2004 | Hoshiba |
|---|---|---|
| D497,349 S | 10/2004 | Hoshiba |
| 6,812,481 B2 | 11/2004 | Matsumura et al. |
| 6,872,585 B2 | 3/2005 | Matsumura et al. |
| D506,449 S | 6/2005 | Hoshiba |
| 7,888,689 B2 | 2/2011 | Kim et al. |
| 2003/0042844 A1 | 3/2003 | Matsumura et al. |
| 2003/0168670 A1* | 9/2003 | Roberts et al. ............ 257/98 |
| 2004/0046242 A1 | 3/2004 | Asakawa |
| 2004/0120155 A1 | 6/2004 | Suenaga |
| 2004/0208964 A1 | 10/2004 | Saxby et al. |
| 2004/0240203 A1 | 12/2004 | Matsumura et al. |
| 2005/0194601 A1 | 9/2005 | Suenaga |
| 2005/0277218 A1 | 12/2005 | Nakajo et al. |
| 2006/0043879 A1 | 3/2006 | Naitou |
| 2007/0187709 A1 | 8/2007 | Yamamoto |
| 2007/0247841 A1 | 10/2007 | Kono et al. |
| 2008/0001163 A1 | 1/2008 | Matsumura et al. |

(Continued)

FOREIGN PATENT DOCUMENTS

| EP | 1396891 A2 | 3/2004 |
|---|---|---|
| EP | 1848037 A2 | 10/2007 |

(Continued)

OTHER PUBLICATIONS

Extended European Search Report of the corresponding European Application No. 09708602.9, dated May 15, 2013.

*Primary Examiner* — Tu-Tu Ho
(74) *Attorney, Agent, or Firm* — Global IP Counselors, LLP

(57) ABSTRACT

A light emitting device includes a package equipped on a front face with a window for installing a light emitting element, and outer lead electrodes that protrude from a bottom face of the package. The package has, on the bottom face, two side face convex components provided on the side face sides and a center convex component provided at a center. The outer lead electrodes are housed in a concave components defined by the side face convex components and the center convex component. The side face convex component has groove provided on the side face.

20 Claims, 18 Drawing Sheets

(56) References Cited

U.S. PATENT DOCUMENTS

2009/0167142 A1 7/2009 Kokubu et al.
2011/0070673 A1 3/2011 Yamamoto

FOREIGN PATENT DOCUMENTS

| | | | |
|---|---|---|---|
| EP | 2082858 | A1 | 7/2009 |
| JP | 2003-078172 | A | 3/2003 |
| JP | 2004-071675 | A | 3/2004 |
| JP | 2006-073656 | A | 3/2006 |
| JP | 2006-128719 | A | 5/2006 |
| JP | 2006-303548 | A | 11/2006 |
| JP | 2007-207986 | A | 8/2007 |
| JP | 2007-311736 | A | 11/2007 |
| JP | 2009-158794 | A | 7/2009 |

* cited by examiner

LIGHT EMITTING DEVICE

CROSS-REFERENCE TO RELATED APPLICATIONS

This is a continuation application of U.S. patent application Ser. No. 12/866,383 filed on Aug. 5, 2010, now pending. This application claims priority to Japanese Patent Application No. 2008-029267 filed on Feb. 8, 2008 and Japanese Patent Application No. 2008-225506 filed on Sep. 3, 2008. The entire disclosures of U.S. patent application Ser. No. 12/866,383 and Japanese Patent Application Nos. 2008-029267 and 2008-225506 are hereby incorporated herein by reference.

BACKGROUND INFORMATION

1. Technical Field

The present invention relates to a light emitting device, and more particularly to a light emitting device which is a surface-mounted type with thin and small size

2. Related Art

Recent years have witnessed the development of high output semiconductor light emitting elements, and light emitting devices in which these are used, and these have been used in a wide range of fields. Advantages to such light emitting devices are that they are compact, have low power consumption, are lightweight, and so forth, so they have been put to use as light sources for backlights of LCD (Liquid Crystal Display) in portable telephones and the like, as light sources for various gauges, as various kinds of reading sensors, and so on (for example, JP-2003-78172-A).

SUMMARY

It has been disclosed in JP-2003-78172-A that a lead, for supporting a package up until the end of a process of bending outer lead electrodes of a light emitting device, is provided to part of a lead frame.

FIG. 12 shows the state midway through the manufacture of the light emitting device discussed in JP-2003-78172-A. In FIG. 12, a package 7 has leads 4b and 4c provided to the top face 10 of the package, leads 4a and 4d provided to the side faces of the package 7, and leads 4e provided to the bottom face of the package. The ends of the leads 4a to 4d are embedded in the package 7, thereby supporting the package 7.

The leads 4e are cut and bent at the broken line portions in the drawing, and are portions that serve as outer lead electrodes. Cutting the leads 4e at the broken line portions results in a state in which the package 7 is supported by the leads 4a to 4d. The leads 4e are subjected to bending in this state. After this, the now-unnecessary leads 4a to 4d are removed from the package to obtain a light emitting device.

However, depending on the conditions under which the package is formed, the package molding material may flow along the leads 4a to 4d and form flash when the leads 4a to 4d are removed. Consequently, the external size of the package 7 ends up being larger than the designed dimensions, albeit only partially. Particularly in the case of a thin light emitting device, the thickness H1 of the package must be reduced, so such flash is undesirable on the top face. Flash that does occur can be taken off by cutting in a subsequent step, for example, but this adds another step and adversely affects production efficiency. Furthermore, since this flash is not always formed in the same size, its removal is difficult to manage with a computer program or the like, so it is not suited to mass production.

Accordingly, with a thin light emitting device, the leads that support the package (hereinafter referred to as support leads) are usually disposed where any flash that should occur will have little effect, that is, only on the side faces of the package.

Also, to reduce the thickness of a light emitting device, outer lead electrodes are extended from the side face-side of the bottom face of the package, and concave components are provided that can accommodate the outer lead electrodes. This does minimize the increase in thickness of the light emitting device attributable to the thickness of the lead frame, but there is a corresponding decrease in the thickness of the side faces of the package. In the manufacturing process, the support leads must be wide enough for the package to the stably supported by the lead frame.

However, if the above-mentioned light emitting device is made smaller with its shape left unchanged, the package side faces also become thinner, so the support leads embedded therein become finer. Consequently, these leads are more prone to being twisted out of shape, and defects such as tilting of the package are more apt to occur. Also, the stress exerted on the package during bending of the outer lead electrodes may cause the narrow support leads to be twisted and the package to be tilted. If the package tilts, the light emitting element cannot be mounted, so this is a cause of defective products. Also, when a thin light emitting device is mounted on a substrate or the like, if there are differences in the height of the outer lead electrodes, or differences in the amount of solder applied to the mounting land pattern, then a mounting defect known as the Manhattan phenomenon may occur, in which a difference in surface tension when the solder melts, or shrinkage stress when the solder solidifies, or the like results in the outer lead electrode on one side being fixed in a state of being lifted up.

In view of this, it is an object of the present invention to achieve a thinner and smaller product as needed in the past, and in particular to provide a light emitting device with which (1) a package fixed to a lead frame can be stably supported in the manufacturing process and (2) mounting defects can be minimized in the mounting of the light emitting device to a substrate or the like.

To accomplish the above purpose, present invention is characterized in that a light emitting device comprises; a package equipped on a front face with a window for installing a light emitting element, and outer lead electrodes that protrude from a bottom face of the package, the package having, on the bottom face, two side face convex components provided on the side face sides and a center convex component provided at a center, the outer lead electrodes being housed in a concave components defined by the side face convex components and the center convex component, the side face convex component having groove provided on the side face.

With the light emitting device, it is preferable that the package has at least two cut-outs, and the outer lead electrodes are disposed directly under the two cut-outs, respectively.

With the light emitting device, it is preferable that the thickness of the side face convex components and the center convex component is substantially the same as the thickness of the outer lead electrodes.

With the light emitting device, it is preferable that the thickness of the package is no more than 1.5 mm.

According to the light emitting device of the present invention, a thinner and smaller light emitting device with which a package can be stably supported in the manufacturing process can be provided. Also, with the light emitting device of the present invention, mounting defects can be minimized in the mounting of the light emitting device to a substrate or the like.

DETAILED DESCRIPTION OF THE PREFERRED EMBODIMENTS

Figure 1A:
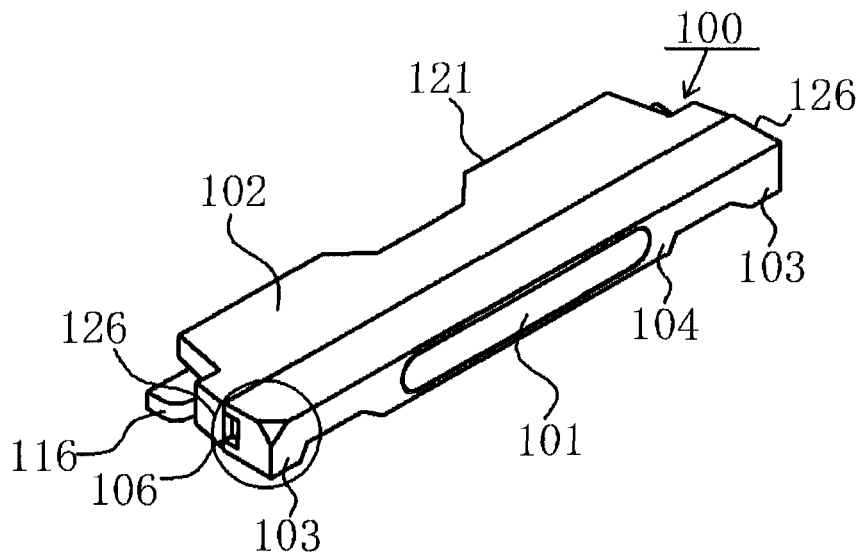
FIG. 1A is an oblique view of the light emitting device according to the present invention.

The best mode for carrying out the invention will now be described through reference to the drawings. The modes discussed below, however, are just examples, and the light emitting device of the present invention is not limited to the following light emitting devices. Furthermore, names and numbers that are the same in the following description refer to members that are the same or analogous, and detailed descriptions thereof will not be repeated.

As shown in FIGS. 1A to 1I, a light emitting device 100 of the present invention has a package 102 equipped on its front face with a window 101 for installing a light emitting element, and outer lead electrodes 116 that protrude from the bottom face of the package 102. With the present invention, the package 102 has on its bottom face two side face convex components 103 and a center convex component 104. The outer lead electrodes 116 are bent and housed in the concave components 107 formed by the side face convex components 103 and the center convex component 104. Grooves 106 are provided on the side faces of the side face convex components 103.

Grooves 106

Figure 10:
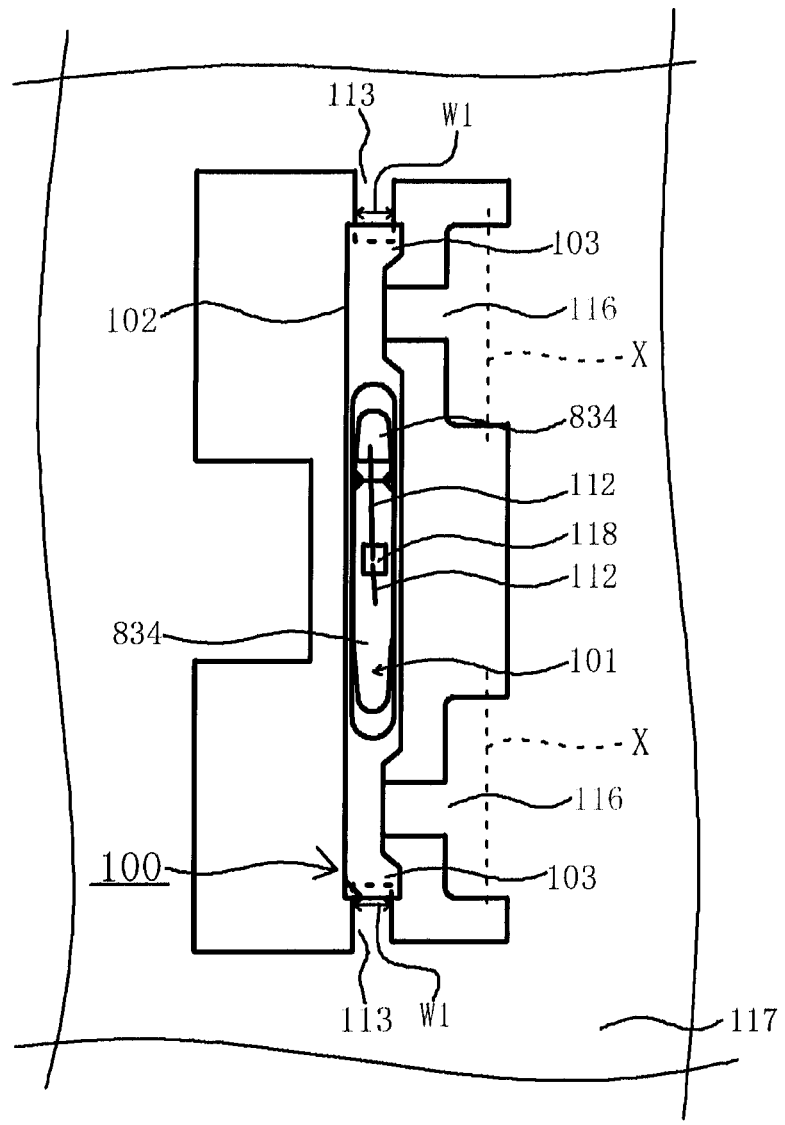
FIG. 10 is a schematic top plan view of a lead flame having the package according to the present invention.

The grooves 106 are portions where the support leads are embedded up until the completion of the bending of the outer lead electrodes 116 in the light emitting device manufacturing process. As shown in FIG. 10, support leads 113 are embedded in the side faces of the side face convex components 103 and the side faces of the package 102. When the support leads 113 are removed from the package 102 in a subsequent step, the portions where the support leads 113 were embedded become grooves. These portions that become grooves lie in substantially the same plane as an inner lead electrode 834 disposed inside the package 102, and the width W2 of the grooves (shown in FIG. 1D) is substantially the same as the thickness of the inner lead electrode 834.

Side Face Convex Components 103

As shown in FIG. 1A, the side face convex components 103 are provided on the side face 126 side of the bottom face of the package. The result of this configuration is that there can be grooves 106 not only on the side faces 126 of the package, but also on the side faces of the side face convex components 103, and as shown in FIG. 10, the width W1 of the support leads 113 does not have to be reduced with this layout.

Furthermore, when the light emitting device 100 is mounted on a substrate or the like, the side face convex components 103 minimize mounting defects. The weight of the light emitting device increases and gravity comes into play as a result of the side face convex component 103 being provided to the side face on the lifted up side prior to the outer lead electrode 116 on one side being soldered in place in a lifted up state. Consequently, lifting up of the outer lead electrodes is suppressed. This allows mounting defects to be minimized.

Figure 8A:
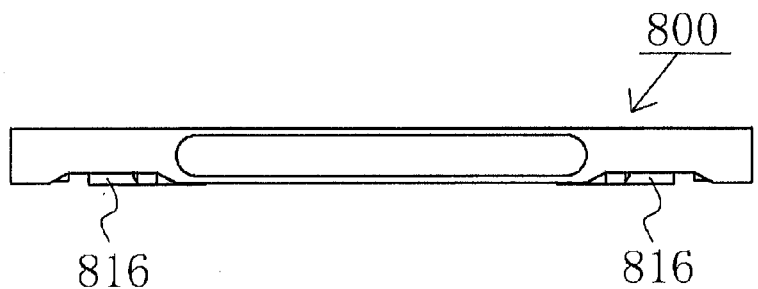
FIG. 8A is an oblique view of an embodiment of the light emitting devices respectively according to the present invention.
Figure 8B:
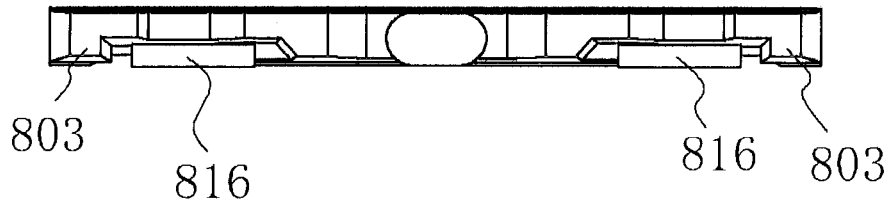
FIG. 8B is a back view of the light emitting device shown in FIG. 8A.
Figure 8C:
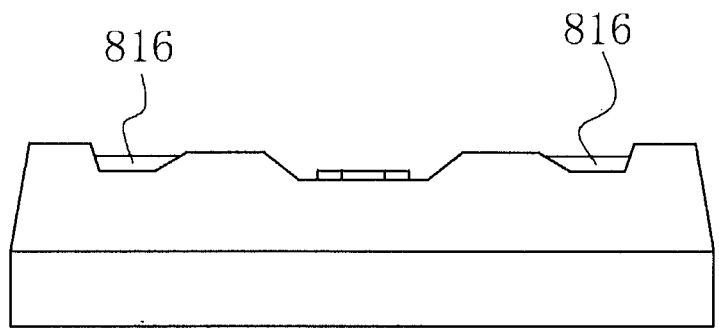
FIG. 8C is a top plan view of the light emitting device shown in FIG. 8A.
Figure 8D:
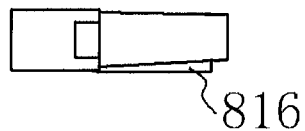
FIG. 8D is a right side view of the light emitting device shown in FIG. 8A.
Figure 8E:
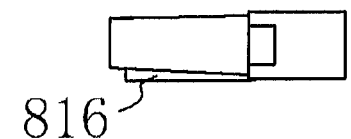
FIG. 8E is a left side view of the light emitting device shown in FIG. 8A.
Figure 8F:
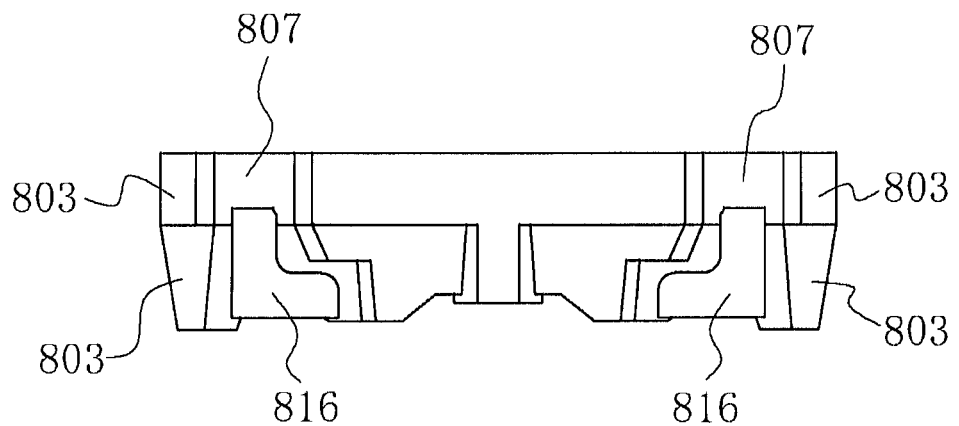
FIG. 8F is a bottom plan view of the light emitting device shown in FIG. 8A.
Figure 8G:
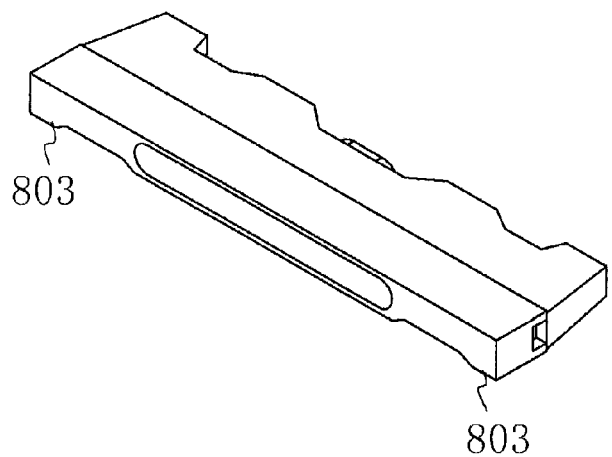
FIG. 8G is an oblique view, which is viewed from obliquely upward, of the light emitting device shown in FIG. 8A.
Figure 8H:
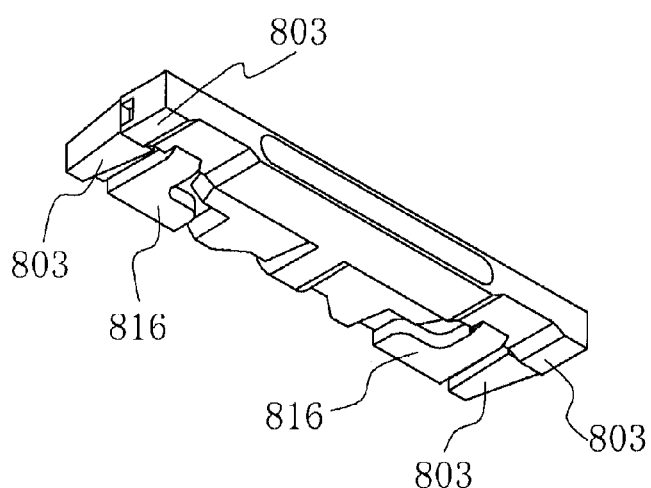
FIG. 8H is an oblique view, which is viewed from obliquely downward, of the light emitting device shown in FIG. 8A.
Figure 8I:
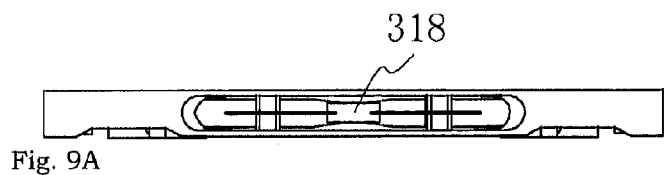
FIG. 8I is a front view in the state that a molding member is not potted of the light emitting device shown in FIG. 8A.

As shown in FIG. 8H, the lifting up of the outer lead electrodes can be further suppressed if side face convex components 803 are provided contiguously from the end on the front face side to the end on the back face side. Also, as shown in FIG. 8H, if convex components are provided so as to cover the outer lead electrodes as viewed from the side face side, then even if some kind of force should be exerted from the side face side of the light emitting device, problems such as the outer lead electrodes being pushed and bent can be avoided. The convex components that protect the outer lead electrodes may be provided integrally with the side face convex components 103 (see the side face convex components 803 in FIG. 8H), or may be provided separately. In this case, at least one of them functions as a side face convex component, and the other convex component serves to protect the outer lead electrodes.

Figure 1B:
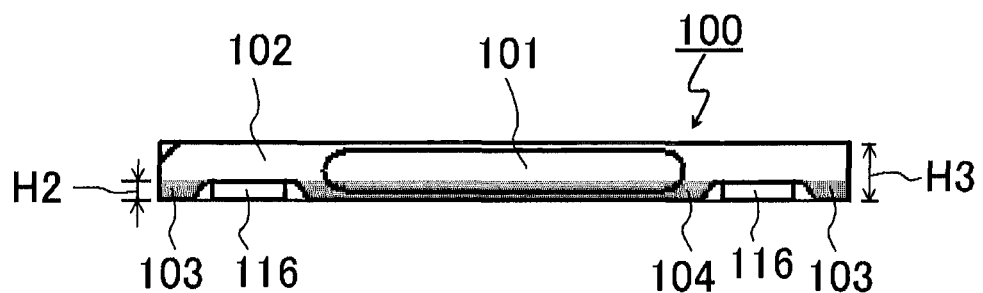
FIG. 1B is a front view of the light emitting device shown in FIG. 1A.
Figure 1C:
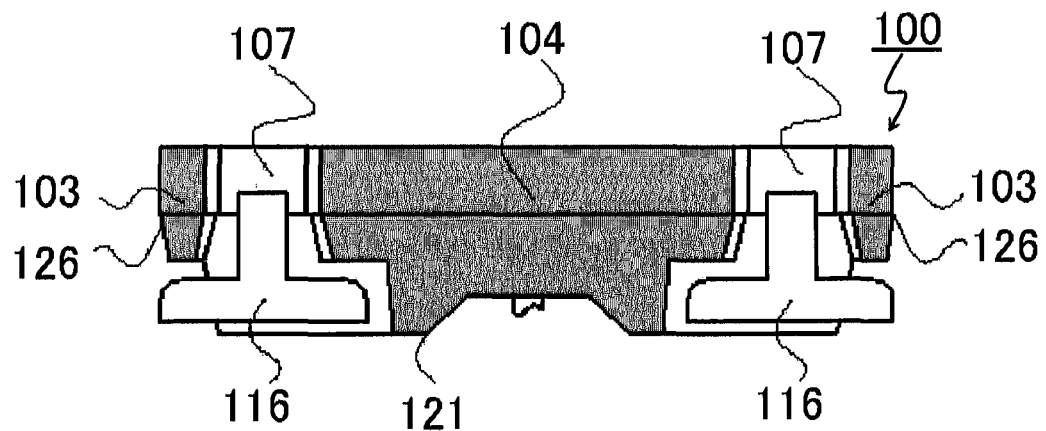
FIG. 1C is a bottom plan view of the light emitting device shown in FIG. 1A.
Figure 1D:
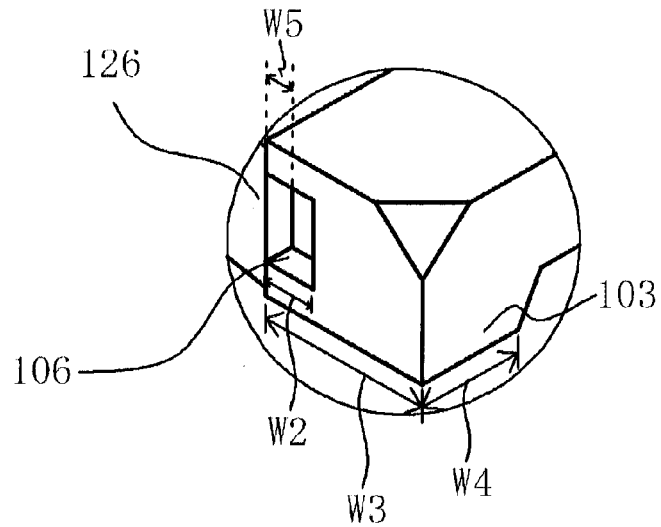
FIG. 1D is a partial enlargement view of the light emitting device shown in FIG. 1A.

As shown in FIG. 1D, the width W3 of the side faces of the side face convex components 103 is preferably greater than the thickness of the lead electrodes, the effect of which is that the light emitting device can be installed stably when mounted on a substrate or the like. Also, the width W4 of the side face convex components 103 as seen from the front face of the package is preferably greater than the depth W5 of the grooves 106. This is because the grooves 106 are the portions where the support leads are embedded, so the package can be securely supported by the lead frame. If the width W4 of the side face convex components 103 is greater than the depth W5 of the grooves, then the side faces of the side face convex components need not be in the same plane as the side faces 126 of the package. Specifically, the side faces of the side face convex components 103 may be formed so that they stick out from the side faces 126 of the package 102, or so that they are recessed.

The side face convex components 103 in FIG. 1B have a trapezoidal shape in plan view, but may instead have some other shape, so long as the grooves 106 can still be formed. Also, with the present invention, the side face convex components 103 each preferably have approximately the same thickness 112. The phrase "have approximately the same thickness" here means that the thickness is substantially the same, and a height difference of from 0 to 0.05 mm is permitted. A configuration such as this allows the light emitting device to be installed stably on a mounting substrate or the like.

Center Convex Component 104

The center convex component 104 is formed in the center of the light emitting device 100 as seen in a front view. The window 101 is formed in the center convex component 104. As shown in FIG. 1A, the bottom face of the center convex component 104 may be formed flat, or it may have an uneven structure. The side face convex components 103 and the center convex component 104 refer to portions that stick out from a reference face, using the bottom face of the package where the outer lead electrodes 116 protrude as this reference face. The side face convex components and the center convex component are indicated by the shaded regions in FIGS. 1B and 1C.

As shown in FIG. 1B, it is preferable if the thickness H2 of the side face convex components 103 and the center convex component 104 is substantially the same as the thickness of the outer lead electrodes 116 in order to improve electrical connection between the mounting substrate and the light emitting device.

The phrase "the thickness is substantially the same" means that there is substantially to height difference between part of the surface of the outer lead electrodes and the side face convex components 103 and the center convex component 104 on the bottom face of the package. Nevertheless, a height difference of 0 to 0.05 mm is permitted.

Concave Components 107

The concave components 107 are formed by being sandwiched between the side face convex components 103 and the center convex component 104. The concave components 107 house the outer lead electrodes 116 that are bent along the bottom face of the package. This allows the outer lead electrodes to be disposed on the package bottom face while reducing the overall thickness of the light emitting device.

Cut-Outs 230

Figure 2A:
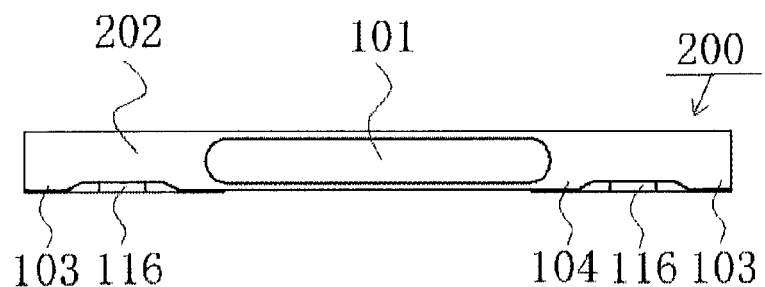
FIG. 2A is an oblique view of an embodiment of the light emitting device according to the present invention.
Figure 2B:
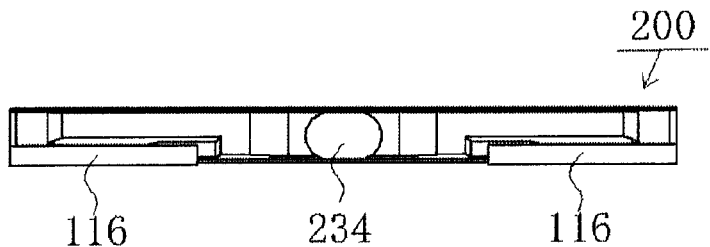
FIG. 2B is a back view of the light emitting device shown in FIG. 2A.
Figure 2C:
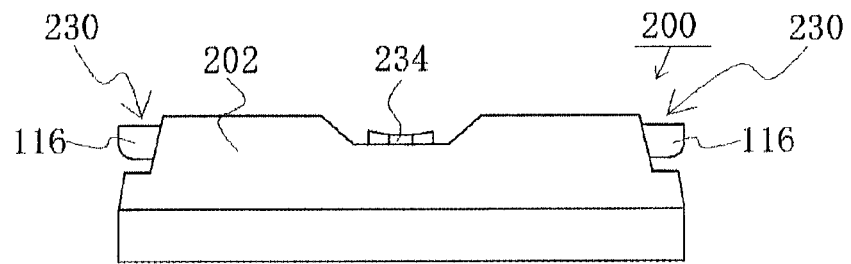
FIG. 2C is a top plan view of the light emitting device shown in FIG. 2A.
Figure 2D:
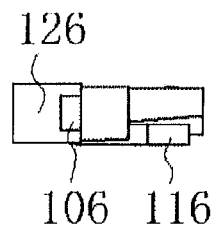
FIG. 2D is a right side view of the light emitting device shown in FIG. 2A.
Figure 2E:
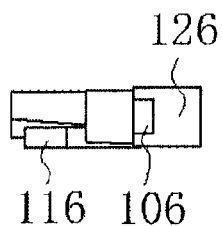
FIG. 2E is a left side view of the light emitting device shown in FIG. 2A.
Figure 2F:
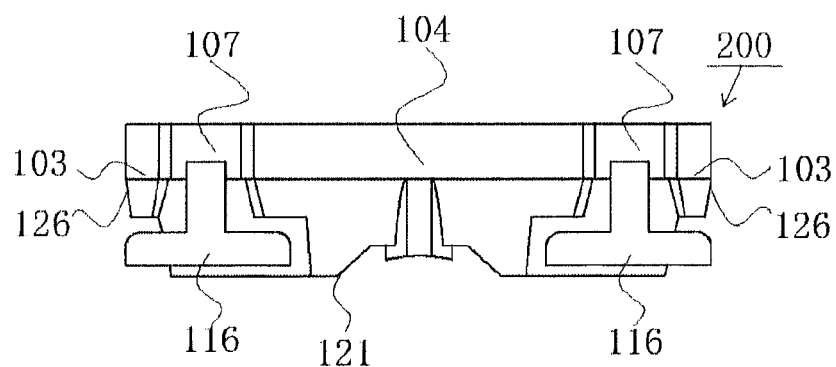
FIG. 2F is a bottom plan view of the light emitting device shown in FIG. 2A.
Figure 2G:
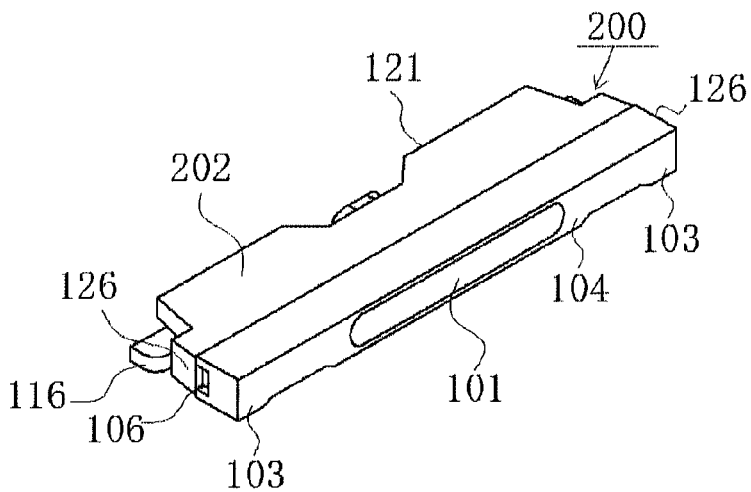
FIG. 2G is an oblique view, which is viewed from obliquely upward, of the light emitting device shown in FIG. 2A.

As shown in FIG. 2C, two cut-outs 230 are formed in the package, and the bent outer lead electrodes 116 are preferably disposed directly under these two cut-outs 230. In other words, the outer lead electrodes 116 are exposed by the cut-outs 230 as viewed from the top face. This makes it possible to check where the outer lead electrodes are disposed. Also, since the outer lead electrodes 116 can be checked from the top face, it is possible to check the mounting state on the substrate when the light emitting device is mounted on a mounting substrate.

Further, a cut-out may be formed in the back face of the package in addition to the cut-outs 230. This cut-out can be formed, for example, at the place where the package molding material is poured in (hereinafter referred to as a gate). This keeps the gate from sticking out beyond the outermost part of the back face of the package.

Package 102

The package 102 of the present invention has the above-mentioned side face convex components 103, the center convex component 104, and the grooves 106. The front face of the package 102 is further equipped with the window 101 for installing the light emitting element, serves as a support that fixes and supports the outer lead electrodes 116, etc., protruding from the bottom face of the package 102, and also has the function of protecting the light emitting element from the external environment.

There are no particular restrictions on the package molding material used in the present invention, but a liquid crystal polymer, a polyphthalamide resin, a polybutylene terephthalate (PBT), or any other known thermoplastic resin can be used. Known thermosetting resins can also be used. In particular, if a semicrystalline polymer resin containing high-melting point crystals, such as a polyphthalamide resin, is used, the resulting package will have high surface energy and good adhesion to the sealing member (discussed below) that fills the inside of the window of the package. This prevents separation at the interface between the package and the sealing member in the cooling step in the course of adding and curing the sealing member.

To reflect light efficiently from the light emitting element, a white pigment such as titanium oxide may be mixed into the package molding material, or the package may be left translucent without mixing in a white pigment, so that the resulting light emitting device has broad light distribution.

Also, as shown in FIG. 10, the window 101 for installing the light emitting element 118 is formed on the front face of the package 102. There are no particular restrictions on the shape of this window, and as long as the light emitting element 118 can be installed and part of the surface of the electrically connected inner lead electrode 834 is exposed inside the window and preferably on the bottom face of the window, the shape of the window may be circular, elliptical, triangular, quadrangular, a shape similar to these, etc. The inner walls of the window are preferably inclined. This allows light from the light emitting element to be reflected by the inner walls of the window, and be taken out in the front face direction more efficiently. Also, the depth of the window 101 can be suitably adjusted according to the number of light emitting elements to be installed, the bonding method, and so forth. The size of the window 101 is preferably larger, so as to obtain a broader light distribution. The bottom face and/or inner walls of the window 101 are preferably embossed, subjected to plasma treatment, etc., to increase the contact surface area and improve adhesion with the sealing member discussed below.

Figure 4A:
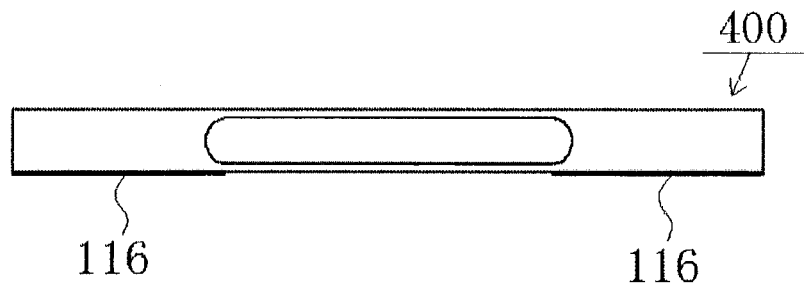
FIG. 4A is an oblique view of an embodiment of the light emitting devices respectively according to the present invention.
Figure 4B:
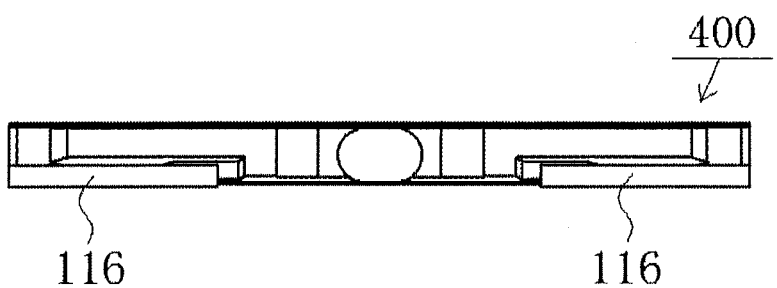
FIG. 4B is a back view of the light emitting device shown in FIG. 4A.
Figure 4C:
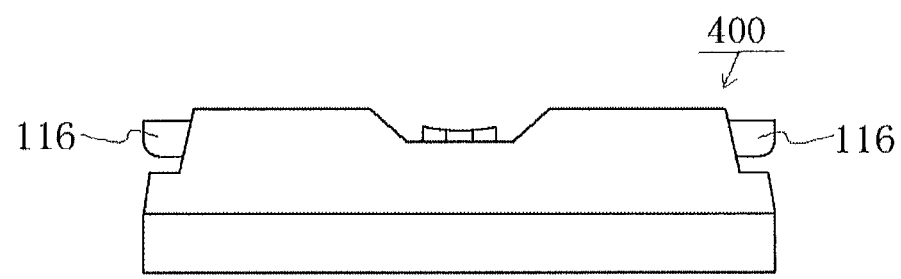
FIG. 4C is a top plan view of the light emitting device shown in FIG. 4A.
Figure 4D:
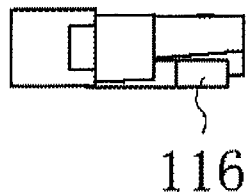
FIG. 4D is a right side view of the light emitting device shown in FIG. 4A.
Figure 4E:
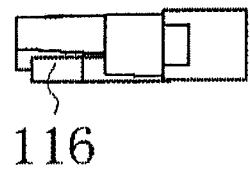
FIG. 4E is a left side view of the light emitting device shown in FIG. 4A.

Also, the front face may be formed in a single plane as shown in FIG. 4A, or it may have stepped portions as shown in FIG. 1A.

Figure 3A:
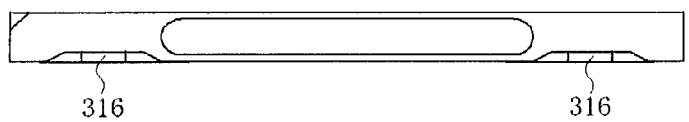
FIG. 3A is an oblique view of an embodiment of the light emitting devices respectively according to the present invention.
Figure 3B:
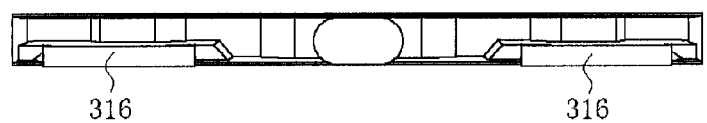
FIG. 3B is a back view of the light emitting device shown in FIG. 3A.
Figure 3C:
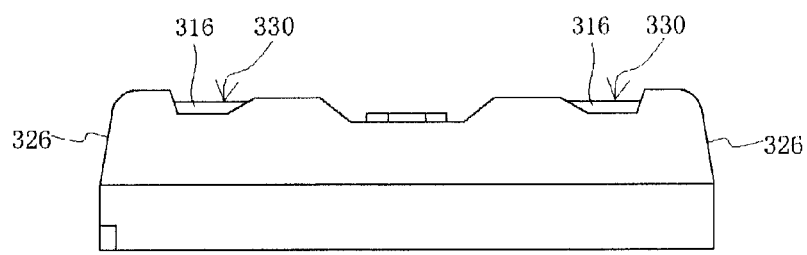
FIG. 3C is a top plan view of the light emitting device shown in FIG. 3A.
Figure 3D:
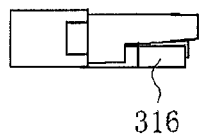
FIG. 3D is a right side view of the light emitting device shown in FIG. 3A.
Figure 3E:
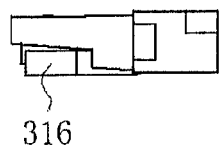
FIG. 3E is a left side view of the light emitting device shown in FIG. 3A.
Figure 3F:
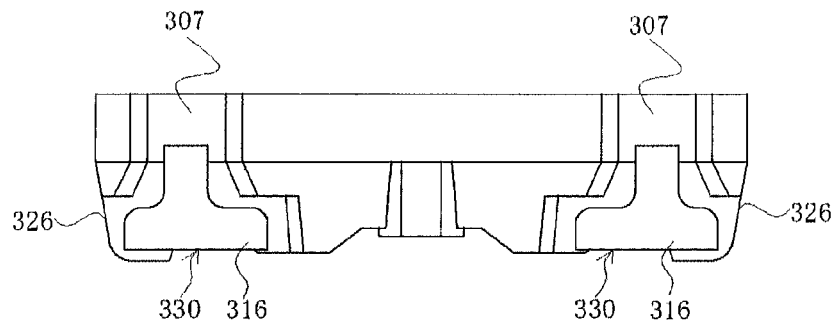
FIG. 3F is a bottom plan view of the light emitting device shown in FIG. 3A.
Figure 3G:
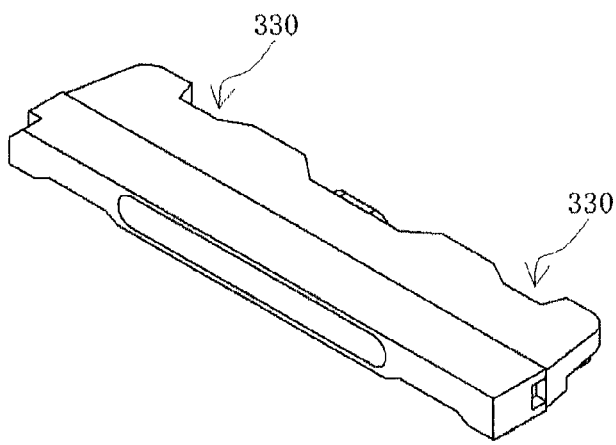
FIG. 3G is an oblique view, which is viewed from obliquely upward, of the light emitting device shown in FIG. 3A.
Figure 3H:
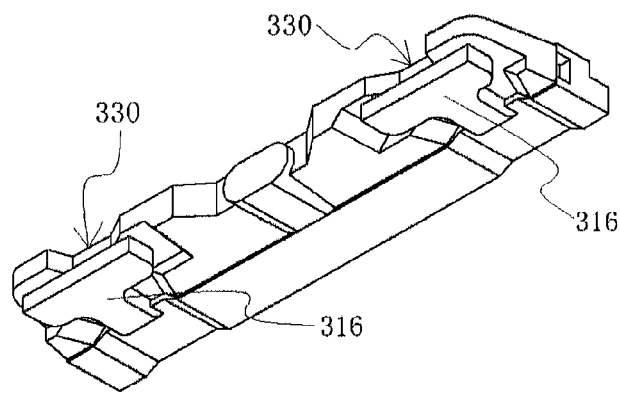
FIG. 3H is an oblique view, which is viewed from obliquely downward, of the light emitting device shown in FIG. 3A.
Figure 3I:
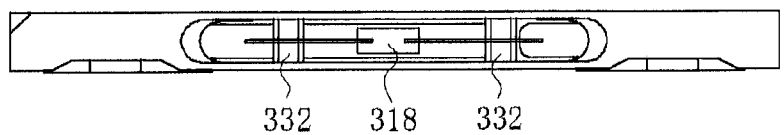
FIG. 3I is a front view in the state that a molding member is not potted of the light emitting device shown in FIG. 3A.

As shown in FIG. 3I, projections 332 can also be provided to the bottom face of the window. Providing these projections 332 keeps a bonding member (not shown) from leaking out to the wire bonding area when a light emitting element 318 is bonded via this bonding member.

As shown in FIG. 1B, the thickness H3 of the package refers to the distance from the upper face of the package to the bottom face of the side face convex components 103 of the package, and in the present invention thinner is better for the purpose of achieving a thinner product. The thickness H3 in the present invention is preferably no more than 1.5 mm.

Figure 2H:
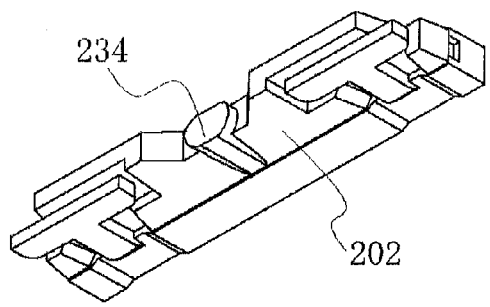
FIG. 2H is an oblique view, which is viewed from obliquely downward, of the light emitting device shown in FIG. 2A.
Figure 2I:
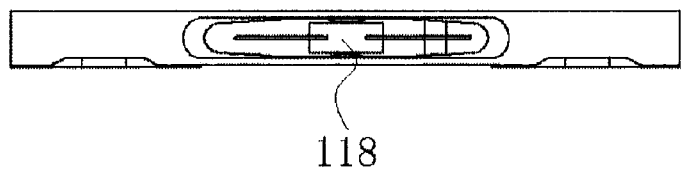
FIG. 2I is a front view in the state that a molding member is not potted of the light emitting device shown in FIG. 2A.

Also, as shown in FIG. 2H, the top and bottom faces of a package 202 can be formed so that the thickness decreases from the front face side toward the back face side. A gate 234 that leads to the back face of the package can also be formed on the bottom face of the package 202. With this constitution, the gate diameter can be increased, and a light emitting device 200 that is compact, has less flash, and is suited to mass production can be obtained.

Lead Electrodes

As shown in FIG. 10, the lead electrodes consist of the inner lead electrode 834 disposed inside the package 102, and portions that become the outer lead electrodes 116 when cut off from a lead frame 117 at a later.

There are no particular restrictions on the material of the lead electrodes as long as it is electroconductive, but it needs to have electrical conductivity and adhesion with the conductive wires and so forth that are the members electrically connected with the light emitting element. A specific electrical resistance is 300 μΩ·cm or less. Favorable examples of materials that satisfy these requirements are iron, copper, iron-containing copper, tin-containing copper, and aluminum, iron, copper, or the like that has been plated with copper, gold, silver, or palladium. The gloss of the plated surface is preferably between 0.2 and 2.0 from the standpoints of light take-off efficiency and manufacturing cost. The plating thickness is preferably 0.5 to 10 μm.

Outer Lead Electrodes 116

The outer lead electrodes 116 are provided to supply electricity from the outside to the light emitting element 118 installed in the window 101. With the present invention, the outer lead electrodes 116 stick out from the bottom face of the package 102, and are bent along the bottom face of the package and housed in the concave components 107.

Also, with the present invention, the outer lead electrodes 116 can be such that their distal ends branch in two parts. For example, as shown in FIG. 1C, the mode can be such that the two distal ends extend in opposite directions from each other, with one distal end extending toward the side face 126 of the package. With a mode such as this, the surface area of the outer lead electrodes 116 can be enlarged, and outer lead electrodes with good heat diffusion can be obtained even with a thinner package.

Figure 6A:
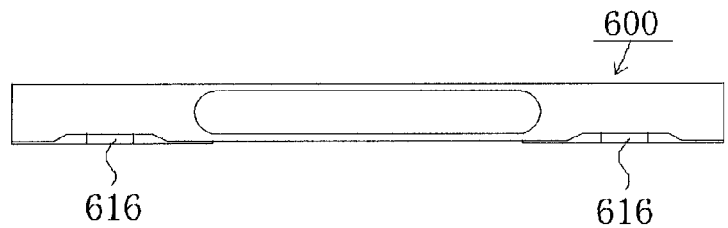
FIG. 6A is an oblique view of an embodiment of the light emitting devices respectively according to the present invention.
Figure 6B:
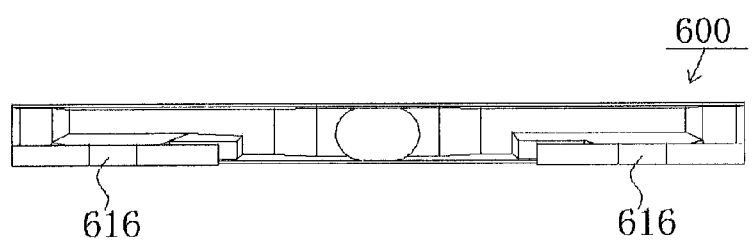
FIG. 6B is a back view of the light emitting device shown in FIG. 6A.
Figure 6C:
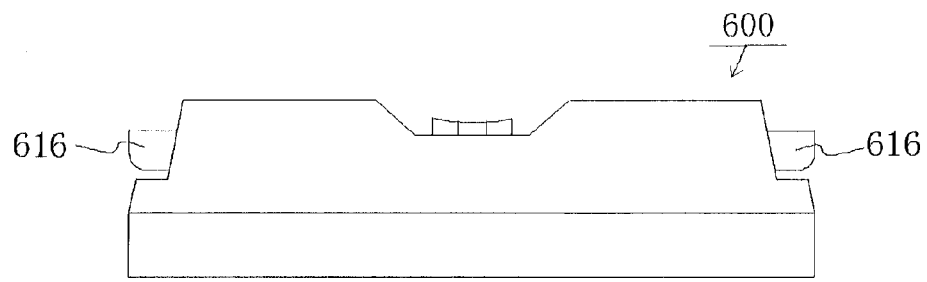
FIG. 6C is a top plan view of the light emitting device shown in FIG. 6A.
Figure 6D:
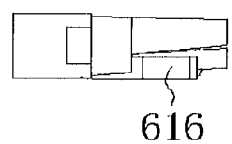
FIG. 6D is a right side view of the light emitting device shown in FIG. 6A.
Figure 6E:
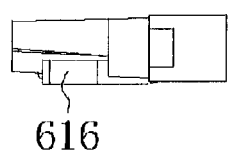
FIG. 6E is a left side view of the light emitting device shown in FIG. 6A.
Figure 6F:
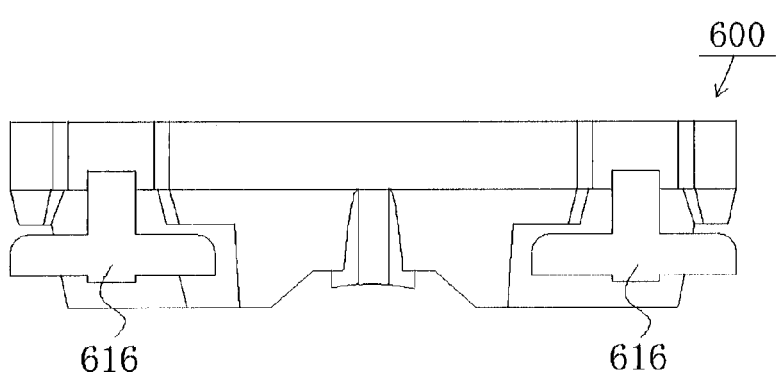
FIG. 6F is a bottom plan view of the light emitting device shown in FIG. 6A.
Figure 6G:
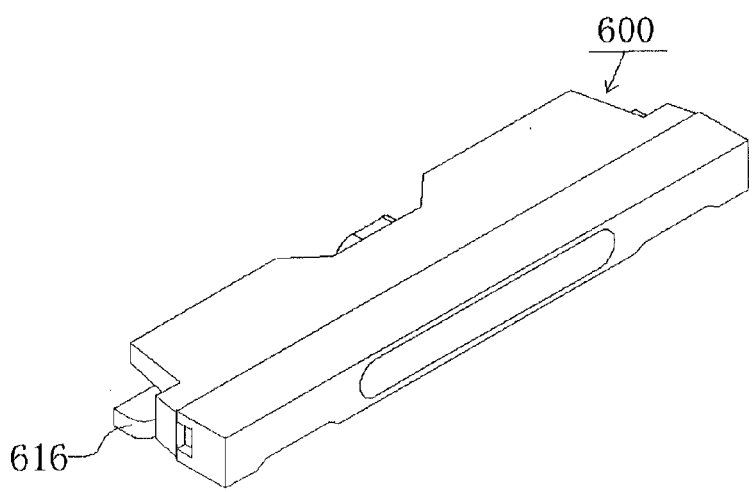
FIG. 6G is an oblique view, which is viewed from obliquely upward, of the light emitting device shown in FIG. 6A.
Figure 6H:
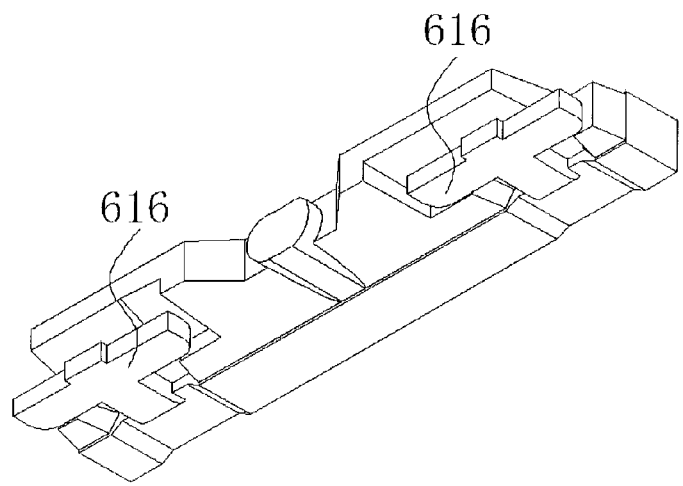
FIG. 6H is an oblique view, which is viewed from obliquely downward, of the light emitting device shown in FIG. 6A.
Figure 6I:
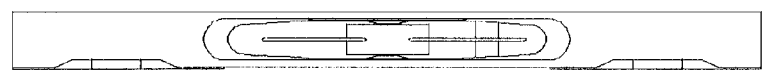
FIG. 6I is a front view in the state that a molding member is not potted of the light emitting device shown in FIG. 6A.

As shown in FIG. 6H, the mode can also be such that outer lead electrodes 616 have distal ends that branch in three parts.

Figure 5A:
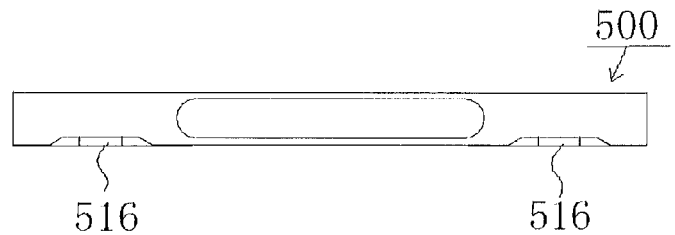
FIG. 5A is an oblique view of an embodiment of the light emitting devices respectively according to the present invention.
Figure 5B:
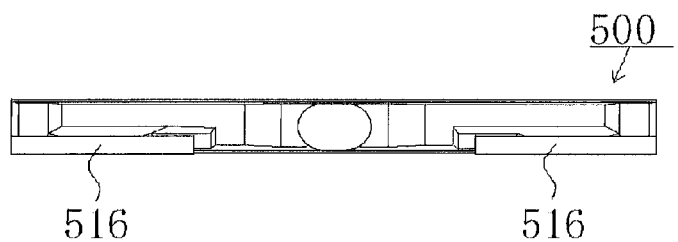
FIG. 5B is a back view of the light emitting device shown in FIG. 5A.
Figure 5C:
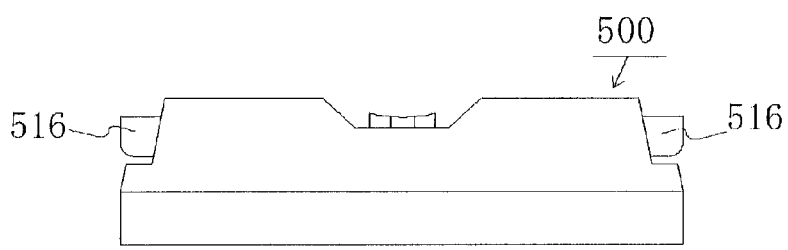
FIG. 5C is a top plan view of the light emitting device shown in FIG. 5A.
Figure 5D:
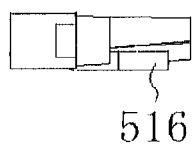
FIG. 5D is a right side view of the light emitting device shown in FIG. 5A.
Figure 5E:
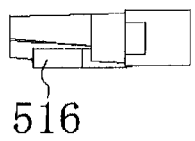
FIG. 5E is a left side view of the light emitting device shown in FIG. 5A.
Figure 5F:
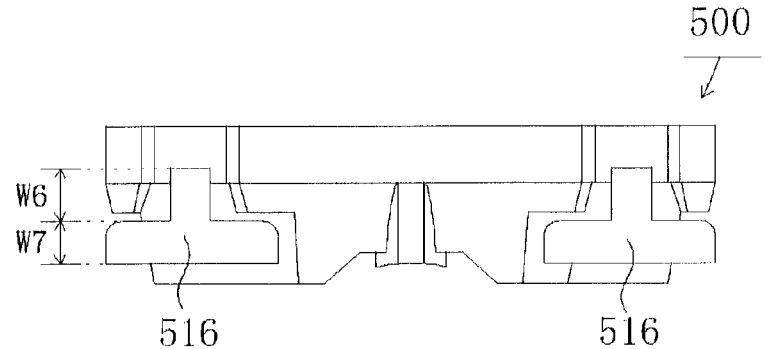
FIG. 5F is a bottom plan view of the light emitting device shown in FIG. 5A.
Figure 5G:
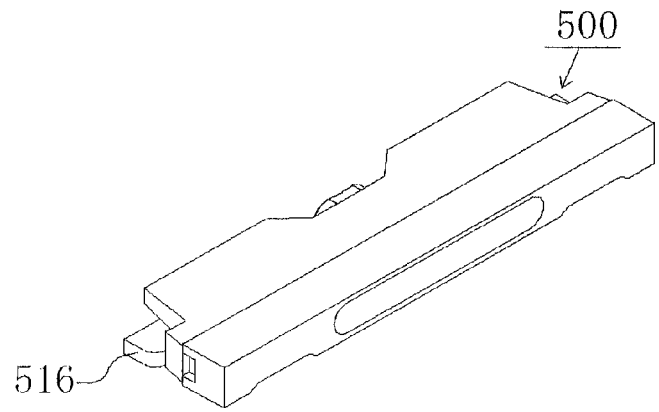
FIG. 5G is an oblique view, which is viewed from obliquely upward, of the light emitting device shown in FIG. 5A.
Figure 5H:
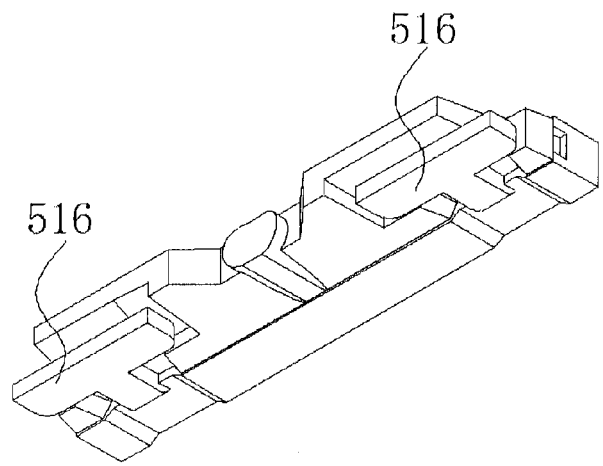
FIG. 5H is an oblique view, which is viewed from obliquely downward, of the light emitting device shown in FIG. 5A.
Figure 5I:
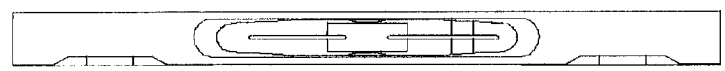
FIG. 5I is a front view in the state that a molding member is not potted of the light emitting device shown in FIG. 5A.

As shown in FIG. 5F, the width W6 and the width W7 of the outer lead electrodes can be varied as appropriate, such as having them be substantially the same.

With the present invention, the outer lead electrodes are preferably disposed so that they do not stick out beyond the widest portion of the package. If the outer lead electrodes are disposed so that they do not stick out beyond the side faces 326 on the back face side of the package, this prevents external force from being exerted on the outer lead electrodes during the mounting of the light emitting device or during the shipping of the light emitting device, so deformation of the outer lead electrodes can be prevented. If the outer lead electrodes 316 are disposed so that they do not stick out beyond the side faces on the back face side of the package, it is preferable to provide cut-outs 330 (see FIG. 3C) in the back face of the package as discussed above. This makes it possible to check where the outer lead electrodes 316 are disposed, and also allows connections during mounting to be checked from the top face.

Inner Lead Electrodes 834

Inner lead electrodes 834 are disposed on the inside of the package 102, and are provided in order to supply the light emitting element with electricity obtained from the outside by the outer lead electrodes 116.

Light Emitting Element 118

The light emitting element 118 installed in the window 101 may be any element so long as it is called the light emitting diode and is formed from any semiconductor material. Examples of the element include one that have the laminated structure containing an active layer and may be Formed from various semiconductor such as nitride semiconductor, InN, AlN, GaN InGaN, AlGaN, InGaAlN and the like; group III-V compound semiconductor, and group I-VI compound semiconductor on a substrate.

With the light emitting device of the present invention, the light emitting element 118 may consist of just one element or a plurality of elements. In the latter case, a plurality of light emitting elements that emit the same color of light may be combined in order to improve luminosity. Also, color reproducibility can be improved by combining a plurality of light emitting elements that emit different colors of light in order to accommodate RGB.

As shown in FIG. 10, these light emitting elements are fixed by a bonding member (not shown) to the surface of the inner lead electrodes 834 or the bottom face of the window 101 of the package 102. The bonding member can be an epoxy resin, a silicone resin, or the like in the case of a light emitting element formed by growing a nitride semiconductor on an insulating substrate (such as a sapphire substrate). Also, when degradation by light or heat from the light emitting element is taken into account, the rear face of the light emitting element may be plated with aluminum, and a conductive paste, a low-melting point metal or other such brazing material, an Au—Sn eutectic material or other such solder, or the like may be used. With a light emitting element in which electrodes are formed on both sides, such as with a light emitting element comprising a conductive substrate (such as GaAs) and emitting red light, the element is fixed by silver, gold, palladium, or another such conductive paste.

Conductive Wire 112

As shown in FIG. 10, conductive wires 112 electrically connect the inner lead electrode 834 with the positive and negative electrodes of the light emitting element 118.

The conductive wires 112 need to have good thermal conductivity, electrical conductivity, mechanical connectability, and ohmic properties with the electrodes of the light emitting element. A thermal conductivity is preferably at least 0.01 cal/(s)(cm$^2$)(° C./cm), and more preferably at least 0.5 cal/(s)(cm$^2$)(° C./cm). When ease of work and so forth are considered, the diameter of the conductive wires is preferably 10 μm or more, and 45 μm or less, and more preferably 25 μm or more, from the standpoints of ease of handling and ensuring adequate light emitting surface area for the light emitting element, no more than 35 μm is still more preferable. Specific examples of such conductive wires include those made of gold, copper, platinum, aluminum, and other such metals, and alloys thereof.

Sealing Member

With the present invention, the window 101 may be sealed by a sealing member. This sealing member protects the light emitting element 118 and the conductive wires 112 from the external environment. The light emitting element 118 and the conductive wires 112 are covered by the sealing member by curing the material of the sealing member that has filled the inside of the window 101 of the package so as to cover the light emitting element 118 and the conductive wires 112.

There are no particular restrictions on the material of the sealing member, but examples include silicone resins, epoxy resins, urea resins, fluororesins, hybrid resins containing one or more of these, and other such translucent resins with excellent weather resistance. The sealing member is not limited to being an organic material, and can also be glass, silica gel, or another such inorganic material with excellent light resistance. Also, thickeners, light diffusers, pigments, fluorescent substances, and the like can be added to the sealing member of the present invention as dictated by the application. Examples of light diffusers include barium titanate, titanium oxide, aluminum oxide, silicon dioxide, calcium carbonate, and mixtures containing one or more of these. The sealing member can also be given a lens effect by putting its light emission face into the desired shape. More specifically, this face can have a convex or concave lens shape, or it can have an elliptical shape as seen from the emitted light observation face, or a plurality of these shapes may be combined.

Fluorescent Substances

The sealing member used in the light emitting device of the present invention can also contain a fluorescent substance that changes the wavelength of the light from the light emitting element. An example of such a fluorescent substance is a fluorescent substance that contains one of the following rare earth elements.

More specifically, examples include garnet type fluorescent materials having at least one element selected from a group consisting of Y, Lu, Sc, La, Gd, Tb and Sm, and at least one element selected from a group consisting of Al, Ga, and In. In particular, an aluminum-garnet-based fluorescent material contains Al and at least one element selected from a group consisting of Y, Lu, Sc, La, Gd, Tb, Eu, Ga, In and Sm, and is activated by at least one element selected from among the rare earth elements, and is a fluorescent material that emits light when excited by UV rays or visible light emitted from the light emitting element. An example is a yttrium-aluminum oxide-based fluorescent material (YAG fluorescent material), as well as $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, $Y_{2.90}Ce_{0.05}Pr_{0.05}Al_5O_{12}$. Of these, the use of two or more kinds of yttrium-aluminum oxide-based fluorescent material with different compositions, containing yttrium, and activated by cerium or praseodymium is particularly favorable for the purposes of the present invention.

A nitride-based fluorescent material is one that contains nitrogen, also contains at least one element selected from a group consisting of Be, Mg, Ca, Sr, Ba and Zn, and at least one element selected from a group consisting of C, Si, Ge, Sn, Ti, Zr and Hf, and is activated by at least one element selected from among the rare earth elements. Examples of the nitride-based fluorescent include $(Sr_{0.97}Eu_{0.03})_2Si_5N_8$, $(Ca_{0.985}Eu_{0.015})_2Si_5N_8$, $(Sr_{0.679}Ca_{0.291}Eu_{0.03})_2Si_5N_8$ and the like.

The method for manufacturing the light emitting device 100 of the present invention will now be described by dividing it into two parts: 1. a method for manufacturing the package 102; and 2. a step of manufacturing the light emitting device 100 from the package 102.

1. Method for Manufacturing Package 102

A method for manufacturing the light emitting device of the present invention will now be described through reference to FIGS. 9A to 9D.

First, a piece of sheet metal is punched out, and the surface thereof is metal plated, which forms a lead frame (not shown) having inner lead electrodes, support leads and a portion that later becomes the outer lead electrodes.

Figure 9A:
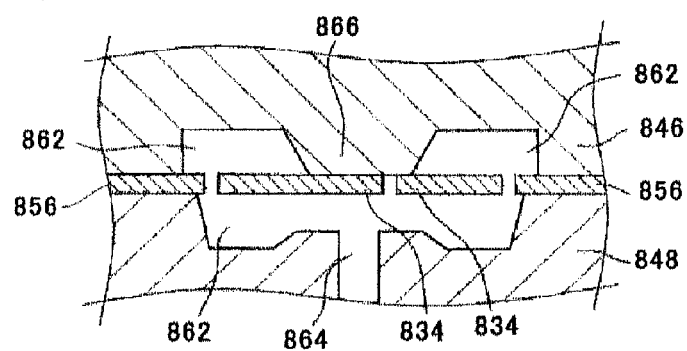
FIG. 9A is a schematic cross-sectional view showing the method for producing the light emitting device according to the present invention.

Then, as shown in FIG. 9A, the inner lead electrodes 834, the support leads 856, and the portion that later becomes the outer lead electrodes are placed between metal molds 846 and 848 for molding a package and which are split into upper and lower parts. The support leads 856 and the inner lead electrodes 834 that are placed inside the package here are positioned so as to be disposed in a cavity 862 between the molds 846 and 848 that have the shape of the package 102, and are sandwiched between the molds 846 and 848. The ends of the support leads 856 remain embedded in the side faces of the package 102 until the package is removed.

The upper mold 846 has a protrusion 866 for forming a window in the package, and concave components (not shown) corresponding to the center convex component 104 and the side face convex components 103 formed on the bottom face of the package in a subsequent step. The lower mold 848 is provided with a material pouring gate 864 and concave components (not shown) corresponding to the center convex component 104 and the side face convex components 103 formed on the bottom face of the package in a subsequent step.

Figure 9B:
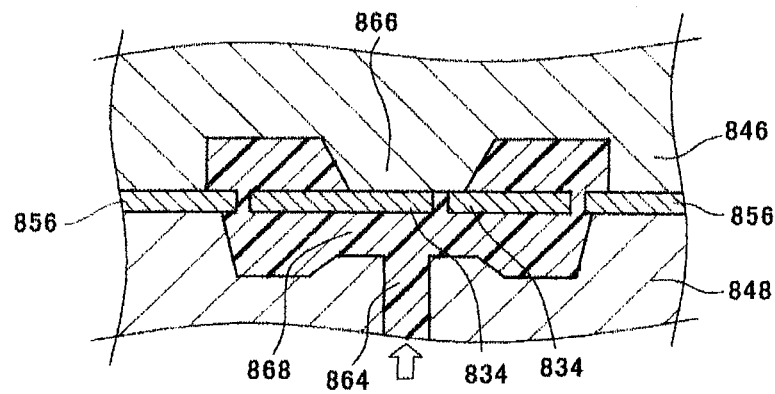
FIG. 9B is a schematic cross-sectional view showing the method for producing the light emitting device according to the present invention.

Then, as shown in FIG. 9B, a molding material 868 is poured into the cavity 862 between the molds 846 and 848 from the material pouring gate 864 of the lower mold 848.

Figure 9C:
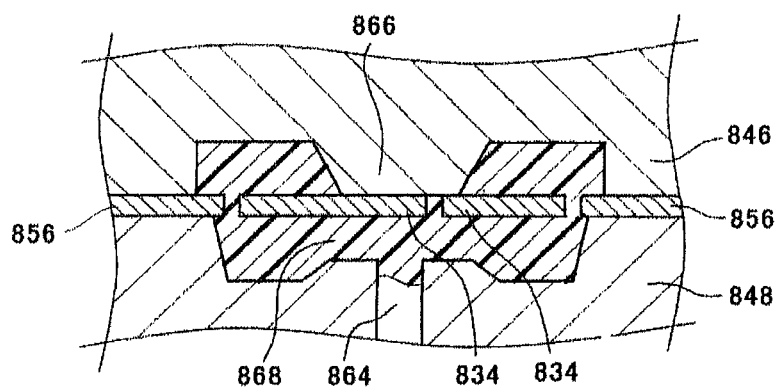
FIG. 9C is a schematic cross-sectional view showing the method for producing the light emitting device according to the present invention.
Figure 9D:
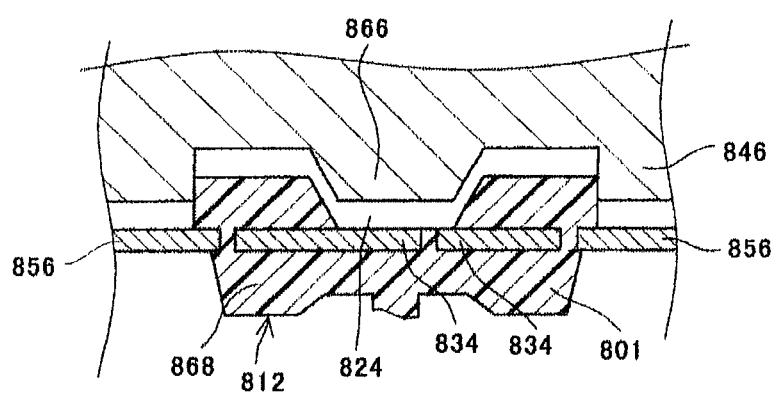
FIG. 9D is a schematic cross-sectional view showing the method for producing the light emitting device according to the present invention.

Next, as shown in FIG. 9C, the molding material 868 is cured, and as shown in FIG. 9D, first the lower mold 848 is removed, and then the upper mold 846 is removed.

The above series of steps gives the lead frame 117 with the attached package 102 as shown in FIG. 10. Specifically, the molded package 102 has the side face convex components 103 on its bottom face, and is equipped with the inner lead electrode 834 exposed on the inside of the window 101. The inner lead electrode 834 is linked to the portion that becomes the outer lead electrodes 116 at a later by cutting from the lead frame. The support leads 113 are embedded in the side faces of the package 102 and in the side faces of the side face convex components 103. In this state, the package 102 is supported on the lead frame 117 by the support leads 113 and the portion that sticks out from the bottom face of the package, and later becomes the outer lead electrodes 116.

Figure 11:
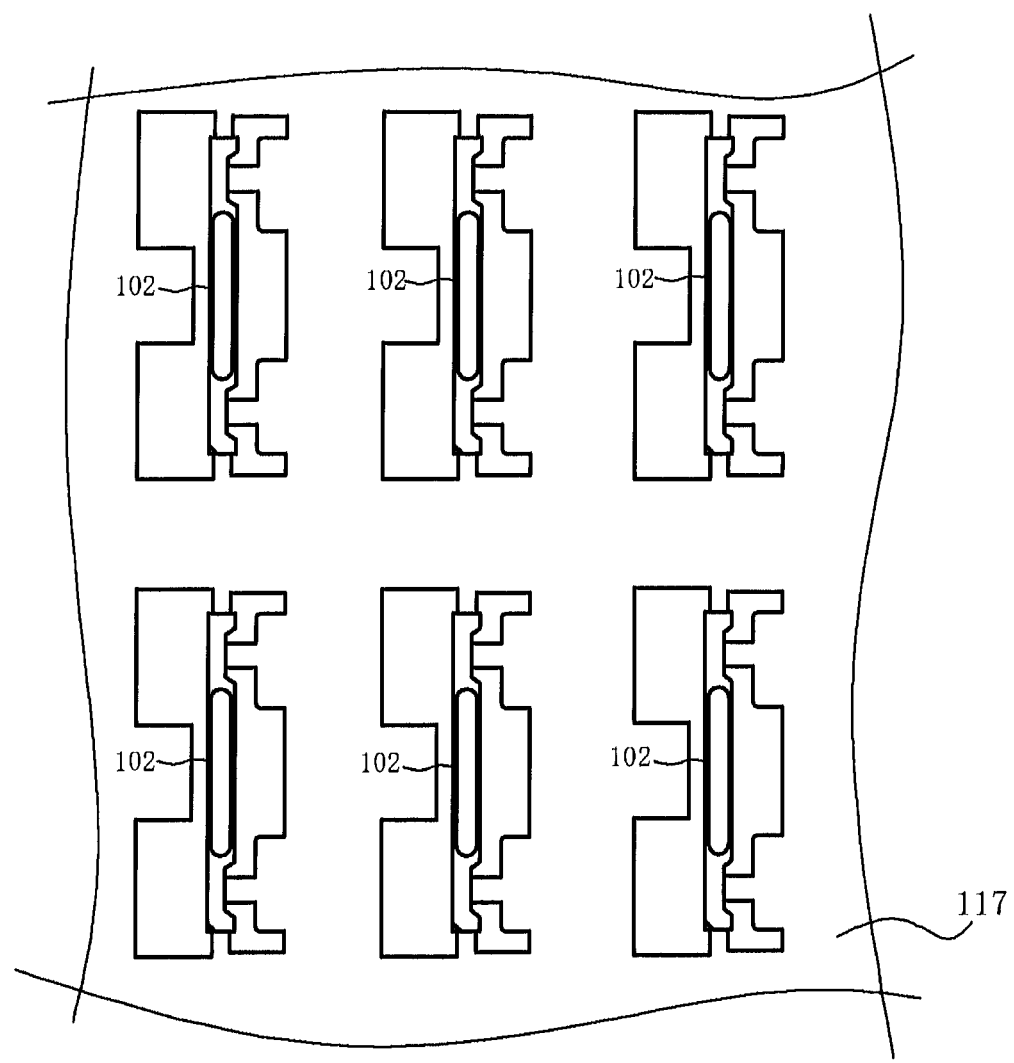
FIG. 11 is a schematic top plan view of a lead flame having the package according to the present invention.
Figure 12:
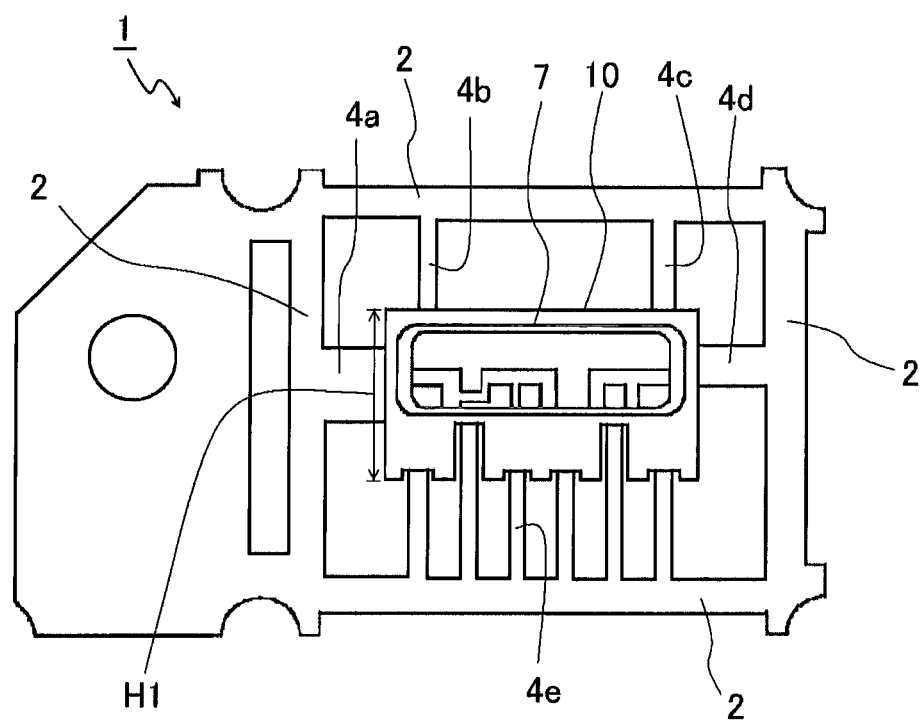
FIG. 12 is a view showing a conventional light emitting device during the production process.

In FIG. 10, just one package 102 was used in the description, but as shown in FIG. 11, usually there are numerous packages 102, 102 . . . (in this drawing, three vertically and two horizontally, for a total of six) formed on a single lead frame 117. When numerous packages 102, 102 . . . are to be manufactured, molds 846 and 848 having numerous package cavities 862 are used, and molding material is poured in simultaneously through these cavities 862, which allows all the packages 102, 102 . . . to be formed at the same time.

2. Method for Manufacturing Light Emitting Device 100

A method for manufacturing the light emitting device 100 using the package 102 obtained in the above manufacturing method will now be described through reference to FIGS. 10 and 11.

After the light emitting element 118 is placed in the window 101 of the package 102, the positive and negative electrodes of the light emitting element 118, and the inner lead electrode 834 disposed inside the package are electrically connected to each other by the conductive wires 112.

Next, the window 101 of the package 102 is filled with a sealing member to seal the light emitting element 118 and the conductive wires 112.

The lead frame 117 is then cut away at the positions marked by the dotted lines X in FIG. 10, resulting in a state in which the package 102 is supported by the support leads 113.

Next, the portions that have become the outer lead electrodes 116 after this cutting are bent along the bottom face of the package 102. At this point the outer lead electrodes 116 may be further bent along the side faces 126.

Also, as shown in FIG. 11, if a plurality of packages 102 is formed on a single lead frame 117, then the bending of the outer lead electrodes can be performed simultaneously for the plurality of packages 102, which improves the manufacturing efficiency of the light emitting device.

Finally, the package 102 is removed from the support leads 113 to obtain the light emitting device 100 shown in FIG. 1.

Example 1

Examples of the light emitting device of the present invention will now be described in detail, but the present invention is not limited to just the examples given below.

As shown in FIGS. 1A to 1D, the light emitting device 100 of the present invention has a package 102 equipped on its front face with a window 101 for installing a light emitting element, and outer lead electrodes 116 that protrude from the bottom face of the package 102. With the present invention, the package 102 has on its bottom face two side face convex components 103 and a center convex component 104. The outer lead electrodes 116 are housed in the concave components 107 formed by the side face convex components 103 and the center convex component 104. Grooves 106 are provided on the side faces of the side face convex components 103.

In this example, first a lead frame is formed in which the surface of a piece of sheet metal composed of iron-containing copper with a thickness of 0.11 mm is plated with silver. The lead frame thus obtained is placed in a metal mold, a polyphthalamide molding material is poured in and cured, and the mold is removed.

The package-attached lead frame formed in this series of steps is such that, as shown in FIG. 10, the support leads 113 are embedded in the side faces of the package 102 and in the side faces of the side face convex components 103, which allows the package to be stably supported up until the completion of the bending step. The light emitting element 118 composed of a nitride semiconductor is bonded and fixed with an epoxy resin to the inner lead electrode 834 exposed on the inside of the window 101 of the package 102 formed as above.

Next, the electrodes of the fixed light emitting element and the inner lead electrodes 834 disposed inside the window of the package 102 are connected to each other with the conductive wires 112, whose main material is gold.

The window 101 of the package 102 is filled with a sealing member obtained by adding a diffusing agent to a silicone resin, and the sealing member is cured.

The portions that will become the outer lead electrodes 116 are then cut away from the lead frame 117, bent along the bottom face of the package in the direction of the back face 121, and housed in the concave components 107. In this example, the distal ends of the outer lead electrodes 116 are branched in two parts and extend in mutually opposing directions, and one end extends toward the side face 126 of the package 102.

Finally, the support leads embedded in the side faces 126 of the package 102 are removed, which separates the light emitting device 100 from the lead frame. At this point, as shown in FIG. 1A, grooves 106 are formed in the side face convex components 103 and the side faces 126 of the package.

The light emitting device 100 formed in this manner has the grooves 106 in the side faces of the side face convex components 103, and the outer lead electrodes 116 are housed in the concave components 107, which allows the package fixed to the lead frame to be stably supported in the manufacturing process, and allows mounting defects to be reduced in mounting to a substrate or the like.

Example 2

FIGS. 2A to 2I show an Example of the light emitting device 200 of the present invention.

With the light emitting device 200 of Example 2, the top face and bottom face are formed so that the thickness decreases from the front face side toward the back face side. A gate 234 is formed on the bottom face of the package so as to lead to the back face of the package. Consequently, the gate diameter can be larger, molten resin can be supplied into the mold at a lower mold internal pressure, and moldability is better, so a light emitting device 200 that has less flash, is compact, and is well suited to mass production can be realized.

According to the light emitting device 200 of Example 2, the same effect is obtained as with the light emitting device in Example 1 above.

Example 3

FIGS. 3A to 3I show an Example of the light emitting device 300 of the present invention.

As shown in FIGS. 3C and 3F, the outer lead electrodes 316 of the light emitting device of Example 3 are housed in concave components 307 on the bottom face of the package so that they do not stick out from the side faces 326 of the package. The light emitting device of Example 3 has cut-outs 330 on the back face of the package, and the outer lead electrodes 316 are disposed directly under these cut-outs 330. Consequently, the places where the outer lead electrodes 316 are disposed can be checked from the top face direction.

Also, as shown in FIG. 3I, there are protrusions 332 on the bottom face of the window. Providing these protrusions 332 keeps a bonding member (not shown) from leaking out to the wire bonding area when the light emitting element 318 is bonded via this bonding member.

According to the light emitting device 300 of Example 3, the same effect is obtained as with the light emitting device in Example 1 above.

Example 4

FIGS. 4A to 4I show an Example of the light emitting device 400 of the present invention.

Figure 4F:
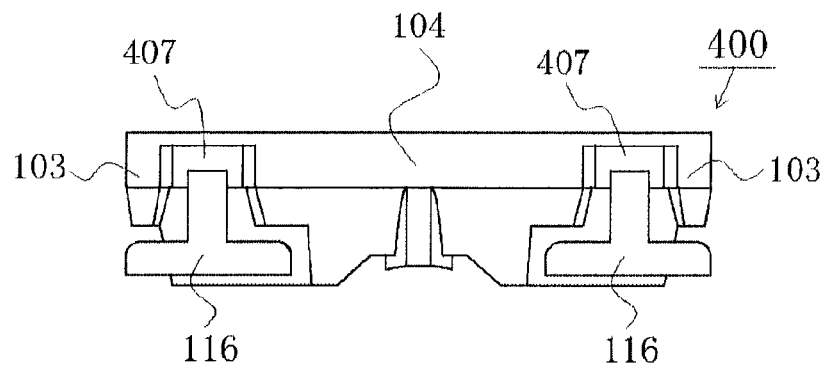
FIG. 4F is a bottom plan view of the light emitting device shown in FIG. 4A.
Figure 4G:
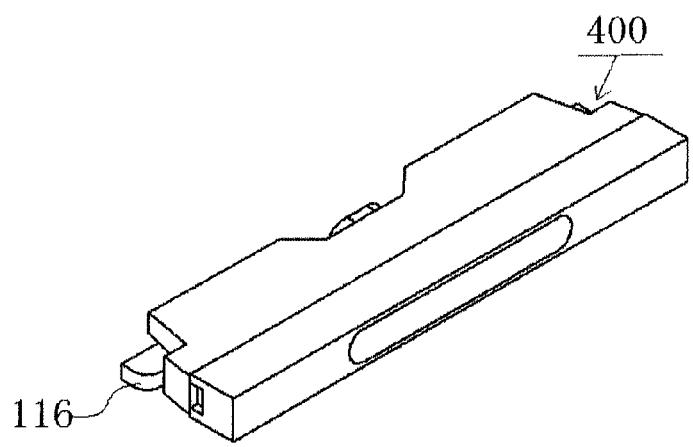
FIG. 4G is an oblique view, which is viewed from obliquely upward, of the light emitting device shown in FIG. 4A.
Figure 4H:
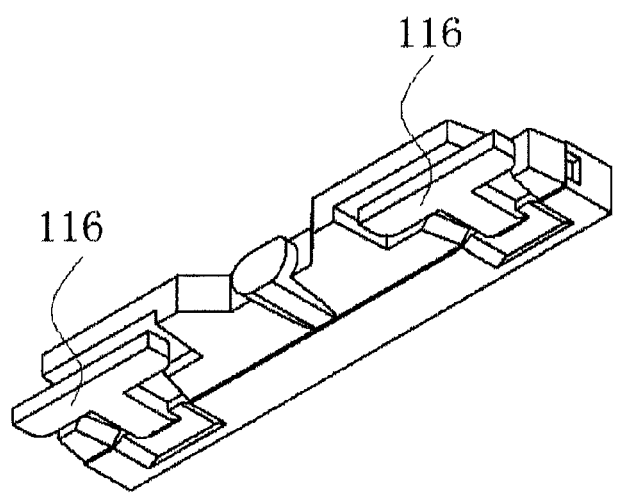
FIG. 4H is an oblique view, which is viewed from obliquely downward, of the light emitting device shown in FIG. 4A.
Figure 4I:
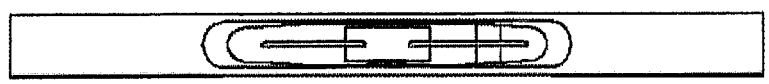
FIG. 4I is a front view in the state that a molding member is not potted of the light emitting device shown in FIG. 4A.

As shown in FIG. 4F, the light emitting device of Example 4 is such that concave components 407 are not provided up to the front face.

According to the light emitting device 400 of Example 4, the same effect is obtained as with the light emitting device in Example 1 above.

Example 5

FIGS. 5A to 5I show an Example of the light emitting device 500 of the present invention.

As shown in FIG. 5F, with the outer lead electrodes 516, the width W6 and the width W7 are formed are formed to be substantially the same.

According to the light emitting device 500 of Example 5, the same effect is obtained as with the light emitting device in Example 1 above.

Example 6

FIGS. 6A to 6I show an Example of the light emitting device 600 of the present invention.

As shown in FIG. 6H, with the outer lead electrodes 616, the distal ends are branched in three parts.

According to the light emitting device 600 of Example 6, the same effect is obtained as with the light emitting device in Example 1 above.

Example 7

FIGS. 7A to 7H show an Example of the light emitting device 700 of the present invention.

Figure 7A:
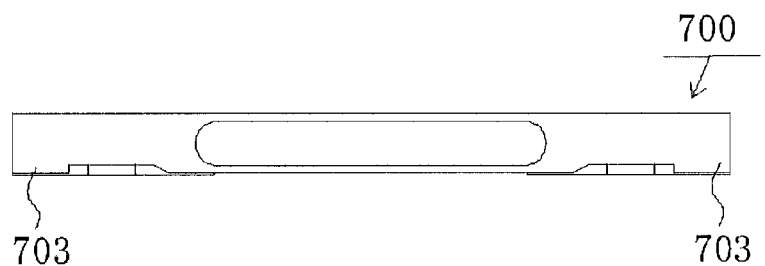
FIG. 7A is an oblique view of an embodiment of the light emitting devices respectively according to the present invention.
Figure 7B:
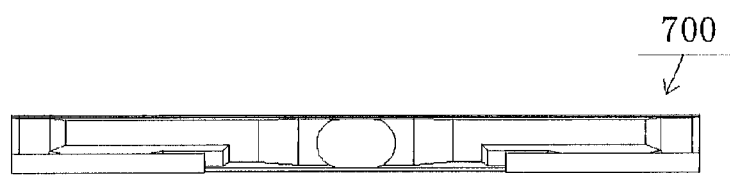
FIG. 7B is a back view of the light emitting device shown in FIG. 7A.
Figure 7C:
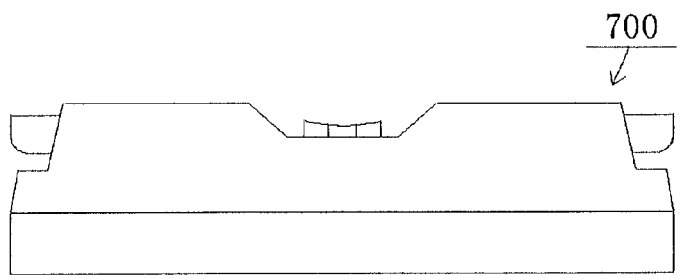
FIG. 7C is a top plan view of the light emitting device shown in FIG. 7A.
Figure 7D:
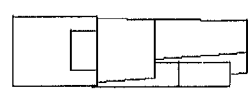
FIG. 7D is a right side view of the light emitting device shown in FIG. 7A.
Figure 7E:
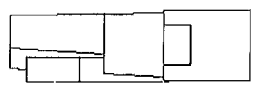
FIG. 7E is a left side view of the light emitting device shown in FIG. 7A.
Figure 7F:
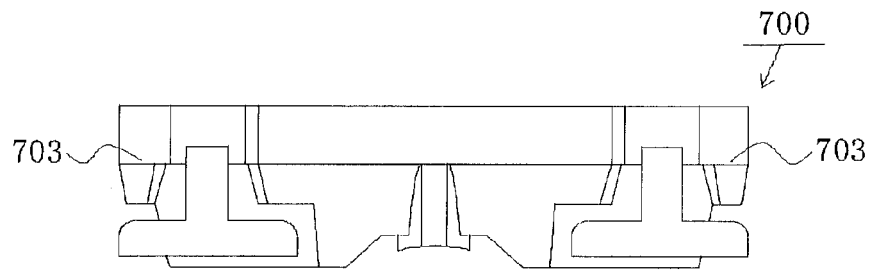
FIG. 7F is a bottom plan view of the light emitting device shown in FIG. 7A.
Figure 7G:
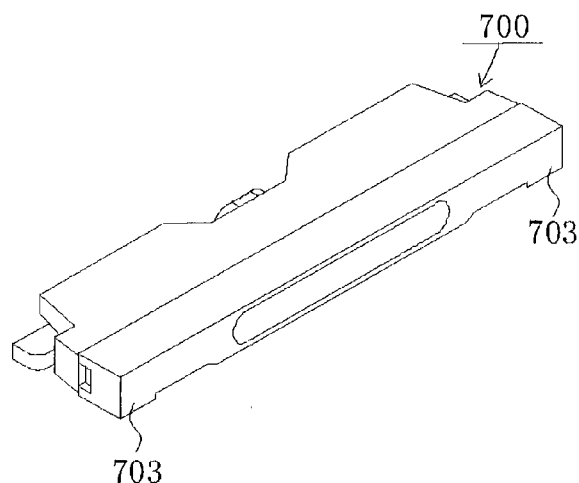
FIG. 7G is an oblique view, which is viewed from obliquely upward, of the light emitting device shown in FIG. 7A.
Figure 7H:
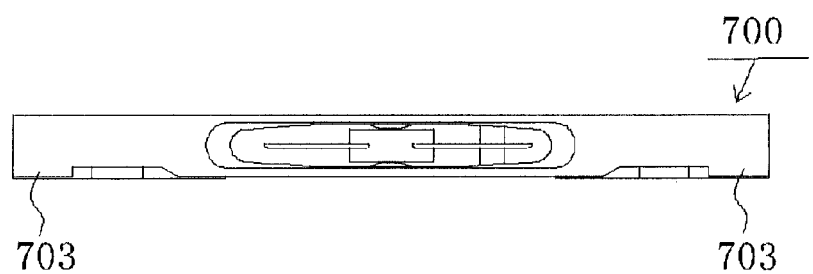
FIG. 7H is a front view in the state that a molding member is not potted of the light emitting device shown in FIG. 7A.

As shown in FIG. 7A, the side face convex components 703 of the package are rectangular in shape as seen from the front face.

According to the light emitting device 700 of Example 7, the same effect is obtained as with the light emitting device in Example 1 above.

Example 8

FIGS. 8A to 8I show an Example of the light emitting device 800 of the present invention.

As shown in FIG. 8H, with the light emitting device of Example 8, the side face convex components 803 on the side faces of the package are provided from the end of the package on the front face side to the end on the back face side, and outer lead electrodes 816 that are bent along the bottom face are housed in concave components 807.

With the light emitting device in this example, as shown in FIGS. 8C and 8F, the outer lead electrodes 816 are formed so that they do not stick out from the package side faces when viewed from the top face and from the bottom face. Also, in this example, as shown in FIGS. 8D and 8E, the outer lead electrodes 816 are formed so that more than half of each one is covered by the side face convex components 803 on the back face side of the package (see FIG. 8H) in side face view. The result of this constitution is that if some force should be applied in the side face direction, it will be less likely that problems will occur, such as the outer lead electrodes 816 being pushed and bent.

According to the light emitting device 800 of Example 8, the same effect is obtained as with the light emitting device in Example 1 above due to the side face convex components 803.

The illustrated embodiments of the light emitting device can be utilized as a light source that is used in liquid crystal display backlights, panel gauges, display lights, portable electronic devices, and so forth.

Description of the Numerals: 100, 200, 300, 400, 500, 600, 700, 800—light emitting device; 101—window; 102, 202—package; 103, 703, 803—side face convex component; 104—center convex component; 106—groove; 107, 307, 407, 807—concave component; 112—conductive wire; 113—support lead; 116, 316, 516, 616, 816—outer lead electrode; 117—lead frame; 118, 318—light emitting element; 121—back face; 126, 326—side face; 230, 330—Cut-out; 234—gate; 332—projection; 834—inner lead electrode; 846, 848—mold; 856—support lead; 862—cavity; 866—protrusion; 864—material pouring gate; and 868—molding material.

What is claimed is:

1. A light emitting device comprising:
a package equipped on a front face with a window for installing a light emitting element, the package having a back face opposed to the front face and a bottom face that is located between the back face and the front face, the bottom face being adjacent to the front face; and
outer lead electrodes that protrude from the bottom face of the package, an end of each of the outer lead electrodes branching in at least two distal end parts that extend in opposite directions from each other on the bottom face, and the outer lead electrodes being disposed so as not to stick out beyond a widest portion of the package as viewed from a front face side of the package.

2. The light emitting device according to claim 1, wherein one of the distal end parts of each of the outer lead electrodes extends toward one of side faces of the package, respectively.

3. The light emitting device according to claim 1, wherein the end of each of the outer lead electrodes branches in three distal end parts.

4. The light emitting device according to claim 1, wherein a thickness of the package is no more than 1.5 mm.

5. The light emitting device according to claim 1, wherein the package has, on the bottom face, two side face convex components provided on both side face sides and a center convex component provided at a center,
the outer lead electrodes are housed in concave components defined by the side face convex components and the center convex component, and
the side face convex components have grooves provided on side faces of the side face convex components.

6. The light emitting device according to claim 5, wherein a thickness of the side face convex components and a thickness of the center convex component are substantially the same as a thickness of the outer lead electrodes.

7. The light emitting device according to claim 1, wherein the package has a groove provided on a side face.

8. The light emitting device according to claim 1, wherein the package has at least two cut-outs that positioned between a side face of the package and the back face, and the outer lead electrodes are exposed by the cut-outs as viewed from a top face that is opposed to the bottom face.

9. The light emitting device according to claim 1, wherein the package has at least two cut-outs on the back face, and the outer lead electrodes are exposed by the cut-outs as viewed from a top face that is opposed to the bottom face.

10. The light emitting device according to claim 1, wherein one of the distal end parts of each of the outer lead electrodes extends toward one of side faces of the package, respectively, and
the package has at least two cut-outs that positioned between a side face of the package and the back face, and the outer lead electrodes are exposed by the cut-outs as viewed from a top face that is opposed to the bottom face.

11. The light emitting device according to claim 1, wherein a thickness of the package is no more than 1.5 mm, and
the package has at least two cut-outs that positioned between a side face of the package and the back face, and the outer lead electrodes are exposed by the cut-outs as viewed from a top face that is opposed to the bottom face.

12. The light emitting device according to claim 1, wherein the package has a groove provided on a side face, and
the package has at least two cut-outs that positioned between a side face of the package and the back face, and the outer lead electrodes are exposed by the cut-outs as viewed from a top face that is opposed to the bottom face.

13. The light emitting device according to claim 1, wherein
one of the distal end parts of each of the outer lead electrodes extends toward one of side faces of the package, respectively,
a thickness of the package is no more than 1.5 mm, and
the package has at least two cut-outs that positioned between a side face of the package and the back face, and the outer lead electrodes are exposed by the cut-outs as viewed from the top face that is opposed to the bottom face.

14. The light emitting device according to claim 1, wherein
one of the distal end parts of each of the outer lead electrodes extends toward one of side faces of the package, respectively,
a thickness of the package is no more than 1.5 mm, and
the package has at least two cut-outs on the back face, and the outer lead electrodes are exposed by the cut-outs as viewed from the top face that is opposed to the bottom face.

15. The light emitting device according to claim 1, wherein
the package has a groove provided on a side face, and
the package has at least two cut-outs on the back face, and the outer lead electrodes are exposed by the cut-outs as viewed from a top face that is opposed to the bottom face.

16. A light emitting device comprising:
a package equipped on a front face with a window for installing a light emitting element, the package having a back face opposed to the front face and a bottom face that is located between the back face and the front face, the bottom face being adjacent to the front face; and
outer lead electrodes that protrude from the bottom face of the package, an end of each of the outer lead electrodes branching in at least two distal end parts that extend in opposite directions from each other on the bottom face, and the outer lead electrodes being disposed on an inside of the light emitting device from side faces of the package.

17. The light emitting device according to claim 16, wherein
one of the distal end parts of each of the outer lead electrodes extends toward one of side faces of the package, respectively, and
a thickness of the package is no more than 1.5 mm.

18. The light emitting device according to claim 16, wherein
a thickness of the package is no more than 1.5 mm, and
the package has a groove provided on a side face.

19. The light emitting device according to claim 16, wherein
a thickness of the package is no more than 1.5 mm,
the package has a groove provided on a side face, and
the package has at least two cut-outs on the back face, and the outer lead electrodes are exposed by the cut-outs as viewed from a top face that is opposed to the bottom face.

20. The light emitting device according to claim 16, wherein
the package has a groove provided on a side face, and
the package has at least two cut-outs on the back face, and the outer lead electrodes are exposed by the cut-outs as viewed from the top face that is opposed to the bottom face.

* * * * *

UNITED STATES PATENT AND TRADEMARK OFFICE
CERTIFICATE OF CORRECTION

| | | |
|---|---|---|
| PATENT NO. | : 8,610,164 B2 | Page 1 of 1 |
| APPLICATION NO. | : 13/665362 | |
| DATED | : December 17, 2013 | |
| INVENTOR(S) | : Saiki Yamamoto | |

It is certified that error appears in the above-identified patent and that said Letters Patent is hereby corrected as shown below:

On the title page, please change the 11th reference in item [56] from

2004/0208964 A1 10/2004 Saxby et al.

to

--2004/0206964 A1 10/2004 Matsumura et al.--

On the title page, please change the 14th reference in item [56] from

2005/0277218 A1 12/2005 Nakajo et al.

to

--2005/0277216 A1 12/2005 Asakawa--

Signed and Sealed this
Second Day of December, 2014

Michelle K. Lee
*Deputy Director of the United States Patent and Trademark Office*